US012591174B2

(12) United States Patent
Singh

(10) Patent No.: US 12,591,174 B2
(45) Date of Patent: *Mar. 31, 2026

(54) MICROLITHOGRAPHIC FABRICATION OF STRUCTURES

(71) Applicant: Molecular Imprints, Inc., Austin, TX (US)

(72) Inventor: Vikramjit Singh, Pflugerville, TX (US)

(73) Assignee: Molecular Imprints, Inc., Austin, TX (US)

( * ) Notice: Subject to any disclaimer, the term of this patent is extended or adjusted under 35 U.S.C. 154(b) by 23 days.

This patent is subject to a terminal disclaimer.

(21) Appl. No.: 18/582,263

(22) Filed: Feb. 20, 2024

(65) Prior Publication Data

US 2024/0248394 A1 Jul. 25, 2024

Related U.S. Application Data

(60) Continuation of application No. 17/819,711, filed on Aug. 15, 2022, now Pat. No. 11,960,204, which is a continuation of application No. 17/072,991, filed on Oct. 16, 2020, now Pat. No. 11,415,883, which is a division of application No. 15/702,175, filed on Sep. 12, 2017, now Pat. No. 10,838,298.

(60) Provisional application No. 62/397,604, filed on Sep. 21, 2016.

(51) Int. Cl.
| | |
|---|---|
| *G03F 7/00* | (2006.01) |
| *G02B 5/18* | (2006.01) |
| *G03F 7/40* | (2006.01) |
| *G02B 27/01* | (2006.01) |

(52) U.S. Cl.
CPC ......... *G03F 7/0005* (2013.01); *G02B 5/1857* (2013.01); *G03F 7/0002* (2013.01); *G03F 7/0037* (2013.01); *G03F 7/40* (2013.01);

*G03F 7/7045* (2013.01); *G02B 2027/0118* (2013.01); *G02B 27/0172* (2013.01); *G02B 2027/0178* (2013.01)

(58) Field of Classification Search
None
See application file for complete search history.

(56) References Cited

U.S. PATENT DOCUMENTS

| | | | |
|---|---|---|---|
| 4,155,627 A | 5/1979 | Gale et al. |
| 4,506,005 A | 3/1985 | Lis |
| 5,273,910 A | 12/1993 | Tran et al. |

(Continued)

FOREIGN PATENT DOCUMENTS

| | | |
|---|---|---|
| CN | 104040407 | 9/2014 |
| EP | 0387407 A1 | 9/1990 |

(Continued)

OTHER PUBLICATIONS

Extended European Search Report in European Appln. No. 17853679.3, dated Aug. 21, 2019, 9 pages.
International Search Report and Written Opinion for International Application No. PCT/US2017/051143, mailed Jan. 11, 2018, 15 pages.
Jet and Flash™ Imprint Lithography (J-FILTM), Molecular Imprints, retrieved from <http://www.molecularimprints.com/technology-overview/j-fil-overview> on Jul. 6, 2016, 4 pages.

(Continued)

*Primary Examiner* — Shamim Ahmed
(74) *Attorney, Agent, or Firm* — Fish & Richardson P.C.

(57) ABSTRACT

Asymmetric structures formed on a substrate and microlithographic methods for forming such structures. Each of the structures has a first side surface and a second side surface, opposite the first side surface. A profile of the first side surface is asymmetric with respect to a profile of the second side surface. The structures on the substrate are useful as a diffraction pattern for an optical device.

15 Claims, 10 Drawing Sheets

(56)      References Cited

U.S. PATENT DOCUMENTS

| | | |
|---|---|---|
| 5,853,959 A | 12/1998 | Brand et al. |
| 7,396,475 B2 | 7/2008 | Sreenivasan |
| 8,268,220 B2 | 9/2012 | Xu et al. |
| 10,838,298 B2 | 11/2020 | Singh |
| 2003/0013831 A1 | 1/2003 | Dammel et al. |
| 2006/0286488 A1 | 12/2006 | Rogers et al. |
| 2007/0020939 A1 | 1/2007 | Lane et al. |
| 2010/0248449 A1 | 9/2010 | Hildreth et al. |
| 2012/0083099 A1 | 4/2012 | Nuzzo et al. |
| 2013/0100362 A1 | 4/2013 | Saeedi et al. |
| 2014/0099792 A1 | 4/2014 | Bergendahl et al. |
| 2014/0285891 A1 | 9/2014 | Heitzmann |
| 2016/0208394 A1 | 7/2016 | McKay, Jr. et al. |
| 2016/0308020 A1 | 10/2016 | Sreenivasan et al. |
| 2017/0363871 A1 | 12/2017 | Vallius et al. |
| 2018/0081265 A1 | 3/2018 | Singh |
| 2018/0107110 A1 | 4/2018 | Singh et al. |
| 2021/0033968 A1 | 2/2021 | Singh |

FOREIGN PATENT DOCUMENTS

| | | | |
|---|---|---|---|
| JP | 2002-328234 A | 11/2002 |
| JP | 2003-057423 A | 2/2003 |
| JP | 2005-157118 A | 6/2005 |
| JP | 2011-065183 A | 3/2011 |
| JP | 2012-233214 A | 11/2012 |
| WO | WO 2016/172116 | 10/2016 |

OTHER PUBLICATIONS

JP Office Action in Japanese Appln. No. 2019-515483, dated Aug. 11, 2021, 39 pages (with English translation).

Notice of Allowance in Korean Appln. No. 10-2019-7011370, dated Nov. 23, 2022, 4 pages (with English translation).

Office Action in Chinese Appln. No. 201780057842.2, dated Apr. 25, 2022, 17 pages (with English translation).

TW Search Report in Taiwan Appln. No. 106131515, dated Mar. 22, 2021, 2 pages (with English translation).

MICROLITHOGRAPHIC FABRICATION OF STRUCTURES

CROSS-REFERENCE TO RELATED APPLICATIONS

This application is a continuation of U.S. application Ser. No. 17/819,711, filed on Aug. 15, 2022, now U.S. Pat. No. 11,960,204, which is a continuation of U.S. application Ser. No. 17/072,991, filed on Oct. 16, 2020, now U.S. Pat. No. 11,415,883, which is a divisional of U.S. application Ser. No. 15/702,175, filed on Sep. 12, 2017, now U.S. Pat. No. 10,838,298, which claims the benefit of the filing date of U.S. Provisional Application No. 62/397,604, filed on Sep. 21, 2016. The contents of U.S. Application No. 62/397,604, Ser. Nos. 15/702,175, 17/072,991, and 17/819,711 are incorporated herein by reference in their entirety.

TECHNICAL FIELD OF THE INVENTION

This invention relates to micro- and nano-structures having desired geometries, and to microlithographic methods of fabricating such structures.

BACKGROUND OF THE INVENTION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

Nano-fabrication can include processing of substrates to form various shaped micro- and nano-structures on or in the substrate. One example process for forming such structures is imprint lithography.

SUMMARY OF THE INVENTION

This specification relates to forming micro- and nano-structures that have asymmetric profiles. Asymmetric structures may, for example, be useful in fabricating more efficient diffraction patterns for optical waveguides. Implementations of the present disclosure include a method for fabricating asymmetric structures by selectively applying a masking material to a substrate and etching portions of the substrate that are not covered by the masking material. For example, the masking material can be applied to regularly shaped discrete structures in a manner such that the subsequent etching sculpts the structures into an asymmetric shape.

In general, innovative aspects of the subject matter described in this specification can be embodied in methods that include the actions of forming a plurality of discrete structures extending from a common surface on a substrate. Applying a masking material over the structures under conditions that cause the masking material to asymmetrically cover the structures such that at least a portion of one side of each structure is free of the masking material. Etching an area of the structures that is not covered by the masking material. And, stripping the masking material from the structures. This and other implementations can each optionally include one or more of the following features.

In some implementations, the conditions that cause the masking material to asymmetrically cover the structures comprise inclining the substrate at a non-normal angle to a deposition direction from which the masking material is applied by a deposition system.

In some implementations, the plurality of structures include a first region of structures and second region of structures. Applying the masking material to the structures asymmetrically can include masking the second region of structures while applying the masking material to the first region of structures. In some implementations, applying the masking material to the structures asymmetrically can include masking the first region of structures while applying the masking material to the second region of structures.

In some implementations, etching an area of the structures comprises performing one of a wet etch process, a dry etch process, or an ion beam etching process.

In some implementations, the portion of one side of each structure that is free of the masking material is a first portion, and the method includes applying a metal catalyst layer for metal assisted chemical etching (MACE) over the structures under second conditions that cause the metal catalyst layer to asymmetrically cover the structures such that at least a second portion of one side of each structure is free of the metal catalyst layer. In some implementations, the second portion is different from the first portion. In some implementations, the conditions that cause the masking material to asymmetrically cover the structures comprise inclining the substrate at a first non-normal angle to an direction from which the masking material is applied by a deposition system, and the second conditions that cause the metal catalyst layer to asymmetrically cover the structures comprise inclining the substrate at a second non-normal angle to an direction from which the metal catalyst layer is applied by the deposition system. The second non-normal angle can be different from the first non-normal angle.

In some implementations, the structures are etched after stripping the masking material from the substrate.

In some implementations, the structures have a square profile, rectangular profile, trapezoidal profile, or a triangular profile before the step of etching the area of the structures.

In some implementations, the masking material includes one of: Cr, Ti, $SiO_2$, $Al_2O_3$, $ZrO_2$, Ag, Pt, or Au. In some implementations, the structures include one of: Si, $SiO_2$, a polymer material, or an organic-inorganic hybrid material. In some implementations, the structures are nano-structures. In some implementations, the structures are micro-structures.

Another general aspect can be embodied in a substrate that includes a plurality of structures on the substrate, each of the structures having a first side surface and a second side surface, opposite the first side surface, and where a profile of the first side surface is asymmetric with respect to a profile of the second side surface. This and other implementations can each optionally include one or more of the following features.

In some implementations, the structures include one of: Si, $SiO_2$, a polymer material, or an organic-inorganic hybrid material. In some implementations, the structures are nano-structures. In some implementations, the structures are micro-structures.

In some implementations, the plurality of structures include a plurality of first structures having a first asymmetric profile and a plurality of second structures having a second asymmetric profile that is different from the first asymmetric profile.

In some implementations, the substrate is included in an optical device. In some implementations, the optical device is an optical wave guide. In some implementations, the optical device is a pair of augmented reality glasses. In some implementations, the plurality of structures form a diffraction pattern.

Particular implementations of the subject matter described in this specification can be implemented so as to realize one or more of the following advantages. Implementations of the present disclosure may improve the fabrication of micro- and nano-patterns of varying profile structures for large patterns of structures. Implementations may permit the fabrication of structures that have varying profiles over different regions of a substrate (e.g., an Si wafer). Implementations may permit the fabrication of more efficient wave (e.g., optical) diffraction patterns. Implementations may permit the manufacture of mechanically stable micro/nano-structures with a high aspect ratio.

As used herein, the terms "micro," "micro-structure," and "micro-feature" represent structures or features of a structure that have at least one dimension that is less than or equal to 50 micrometers.

As used herein, the terms "nano," "nano-structure," and "nano-feature" represent structures or features of a structure that have at least one dimension that is less than or equal to 500 nanometers.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Various examples of fabricating micro- and nano-structures that have asymmetric profiles are described below.

Asymmetric structures may, for example, be useful in fabricating more efficient diffraction gratings for optical waveguides. Generally, these examples include selectively applying a masking material to a substrate and etching portions of the substrate that are not covered by the masking material. For example, the masking material can be applied to regularly-shaped discrete structures in a manner such that the subsequent etching sculpts the structures into an asymmetric shape.

Figure 1:
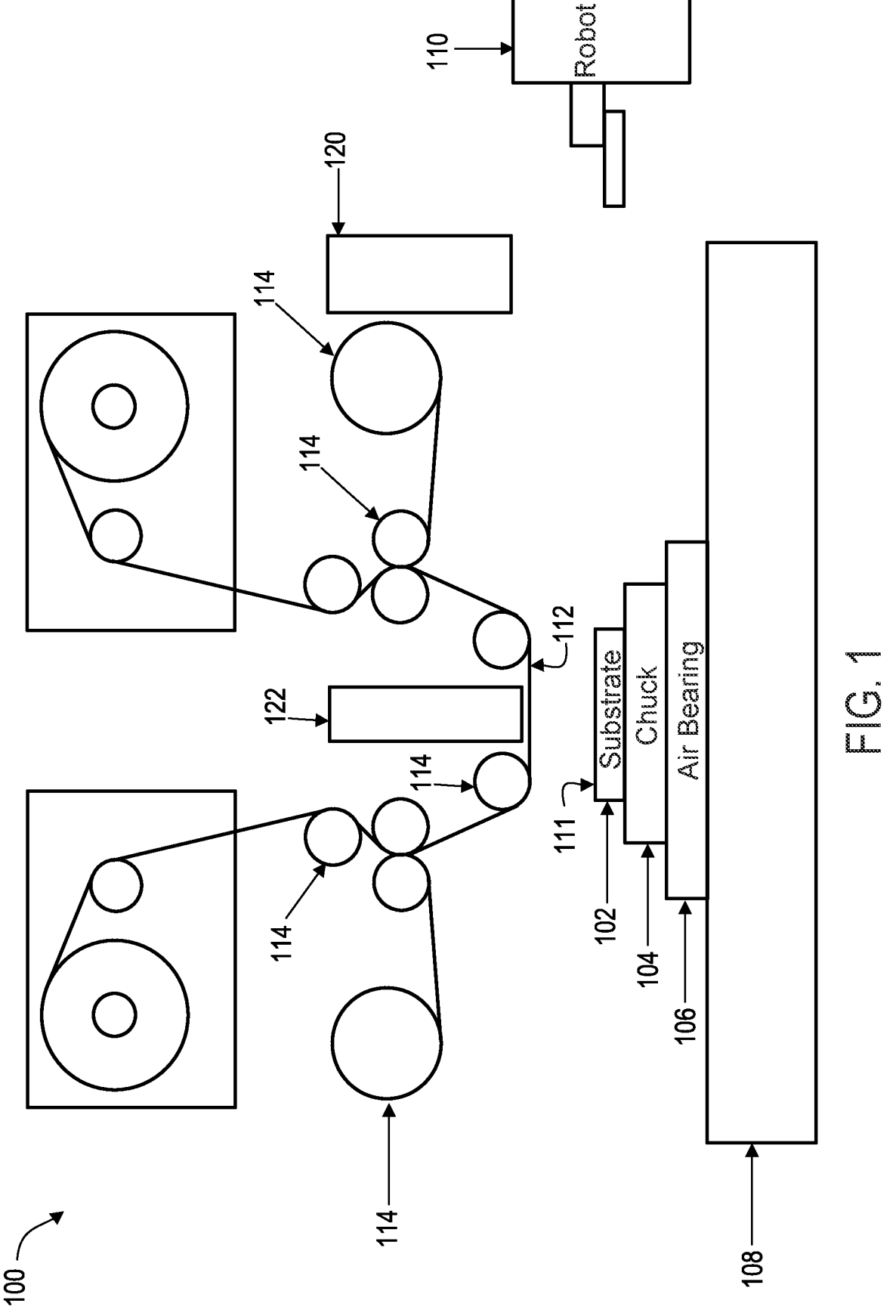
FIG. 1 illustrates a simplified side view of a lithographic system.

FIG. 1 illustrates an imprint lithography system 100 that forms a relief pattern on a substrate 102. The substrate 102 may be coupled to a substrate chuck 104. In some examples, the substrate chuck 104 can include a vacuum chuck, a pin-type chuck, a groove-type chuck, an electromagnetic chuck, and/or the like. In some examples, the substrate 102 and the substrate chuck 104 may be further positioned on an air bearing 106. The air bearing 106 provides motion about the x-, y-, and/or z-axes. In some examples, the substrate 102 and the substrate chuck 104 are positioned on a stage. The air bearing 106, the substrate 102, and the substrate chuck 104 may also be positioned on a base 108. In some examples, a robotic system 110 positions the substrate 102 on the substrate chuck 104.

The substrate 102 can include a planar surface 111 positioned opposite the substrate chuck 104. In some examples, the substrate 102 can be associated with a thickness that is substantially uniform (constant) across the substrate 102.

The imprint lithography system 100 further includes an imprint lithography flexible template 112 that is coupled to one or more rollers 114, depending on design considerations. The rollers 114 provide movement of a least a portion of the flexible template 112. Such movement may selectively provide different portions of the flexible template 112 in superimposition with the substrate 102. In some examples, the flexible template 112 includes a patterning surface that includes a plurality of structures, e.g., spaced-apart recesses and protrusions. However, in some examples, other configurations of structures are possible. The patterning surface may define any original pattern that forms the basis of a pattern to be formed on substrate 102. In some examples, the flexible template 112 may be coupled to a template chuck, e.g., a vacuum chuck, a pin-type chuck, a groove-type chuck, an electromagnetic chuck, and/or the like.

The imprint lithography system 100 may further comprise a fluid dispense system 120. The fluid dispense system 120 may be used to deposit a polymerizable material on the substrate 102. The polymerizable material may be positioned upon the substrate 102 using techniques such as drop dispense, spin-coating, dip coating, chemical vapor deposition (CVD), physical vapor deposition (PVD), thin film deposition, thick film deposition, and/or the like. In some examples, the polymerizable material is positioned upon the substrate 102 as a plurality of droplets.

Figure 2:
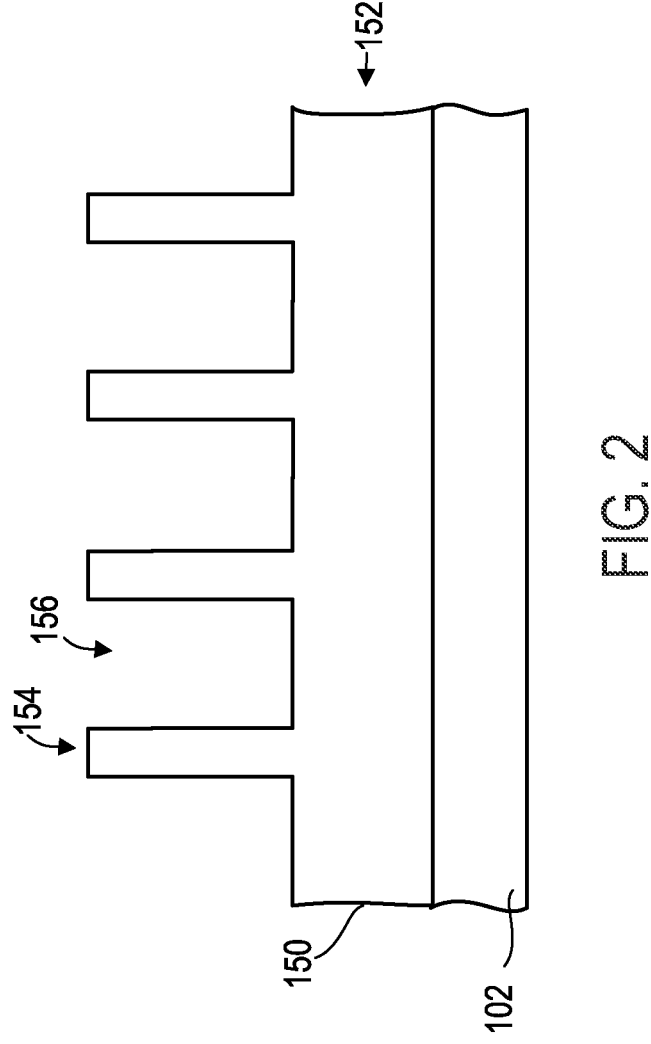
FIG. 2 illustrates a simplified side view of a substrate having a patterned layer positioned thereon.

Referring to FIGS. 1 and 2, the imprint lithography system 100 may further comprise an energy source 122 coupled to direct energy towards the substrate 102. In some examples, the rollers 114 and the air bearing 106 are configured to position a desired portion of the flexible template 112 and the substrate 102 in a desired positioning. The imprint lithography system 100 may be regulated by a processor in communication with the air bearing 106, the rollers 114, the fluid dispense system 120, and/or the energy source 122, and may operate on a computer readable program stored in a memory.

In some examples, the rollers 114, the air bearing 106, or both, vary a distance between the flexible template 112 and the substrate 102 to define a desired volume therebetween that is filled by the polymerizable material. For example, the flexible template 112 contacts the polymerizable material. After the desired volume is filled by the polymerizable material, the energy source 122 produces energy, e.g., broadband ultraviolet radiation, causing the polymerizable material to solidify and/or cross-link conforming to shape of a surface of the substrate 102 and a portion of the patterning surface of the flexible template 112, defining a patterned layer 150 on the substrate 102. In some examples, the patterned layer 150 may comprise a residual layer 152 and a plurality of structures shown as protrusions 154 and recessions 156.

Figure 3A:
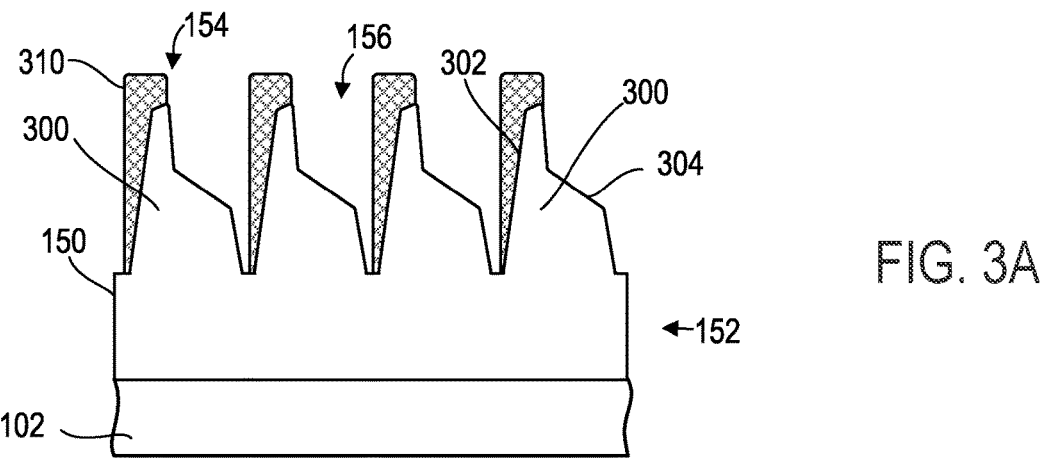
FIGS. 3A-3C illustrate simplified side views of substrates having example asymmetric structures patterned thereon.
Figure 3B:
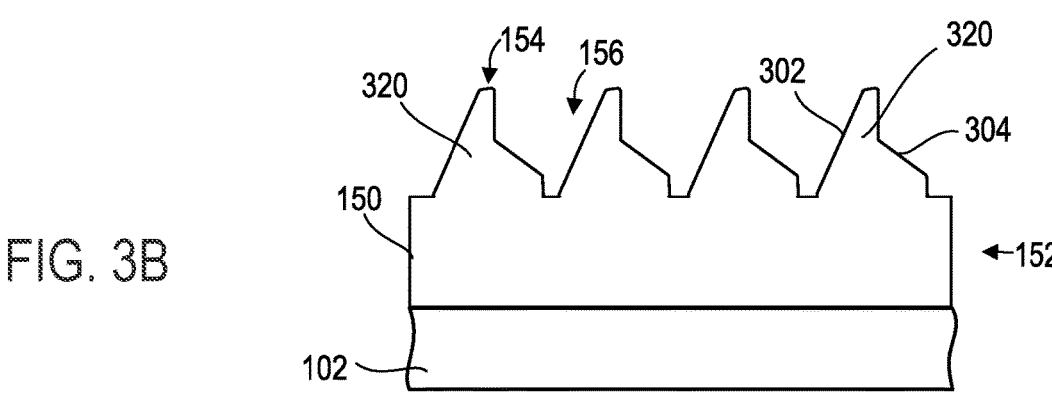
Figure 3C:
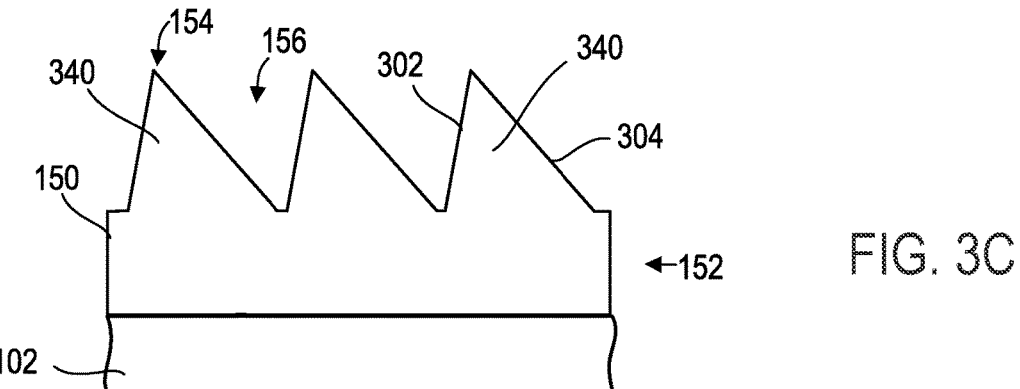

FIGS. 3A-3C illustrate simplified side views of substrates 102 having patterned layer 150 with example asymmetric structures 300, 320, 340 patterned thereon. More specifically, FIGS. 3A and 3B illustrate example structures 300, 320 that have a "chair-like" asymmetric profile and FIG. 3C illustrates example structures 340 that have an asymmetric triangular profile. The structures 300, 320, 340 each include a first side surface 302 and a second side surface 304. As shown, the second side surface 304 of each structure 300, 320, 340 is fabricated to be asymmetric to the respective first side surface 302.

The patterned layer 150 and structures 300, 320, 340 can be fabricated using materials including, but not limited to, Si, SiO$_2$, polymer materials, or organic-inorganic hybrid materials. An example, organic-inorganic hybrid material is a film or patterned layer composed of 2,4,6,8-tetramethyl-cyclotetrasiloxane exposed to Ar and oxygen based plasma under atmospheric or low pressure conditions which forms a carbon polymer layer with methyl groups and silicon oxide. Another example, organic-inorganic hybrid material is hexachlorodisilane which can be used to deposit silicon nitride on a substrate. In another example, hexachlorodisilane can be used with Ar/O$_2$ plasma to deposit silicon oxy-nitride to form a clear film of high index (n<1.7). These layers can be deposited and etched or deposited directly over relief structures. In addition, the structures 300, 320, 340 can be, for example, micro- or nano-structures.

In some implementations, a plurality of different types of asymmetric structures 300, 320, 340 are included on a single substrate. For example, substrate 102 can include a patterned layer 150 that is fabricated to include a structures 300 in a first region, structures 320 in a second region, and structures 340 in a third region.

In some implementations, the asymmetrically profiled structures such as structures 300, 320, 340 are more mechanically stable while still providing a high aspect ratio geometry than some symmetric structures such as tall and narrow rectangular structures. For example, a high aspect ratio profile is desirable for fabricating a glancing angle deposition (GLAD) based imprints for wire grid polarizers over rigid or plastic substrates. However, symmetric structures that have a high aspect ratio (e.g., as shown in FIG. 2) may be less mechanically stable, whereas, mechanical stability can improved in structures that use an asymmetric profile. Furthermore, a greater volume of metal 310 (e.g., Al) can be asymmetrically deposited on a stable asymmetric profile (e.g., as shown in FIG. 3A) than on a less stable symmetric structure. In some examples, the metal 310 can also be packed higher vertically when deposited on an asymmetric structure than on symmetric structures.

Figure 4:
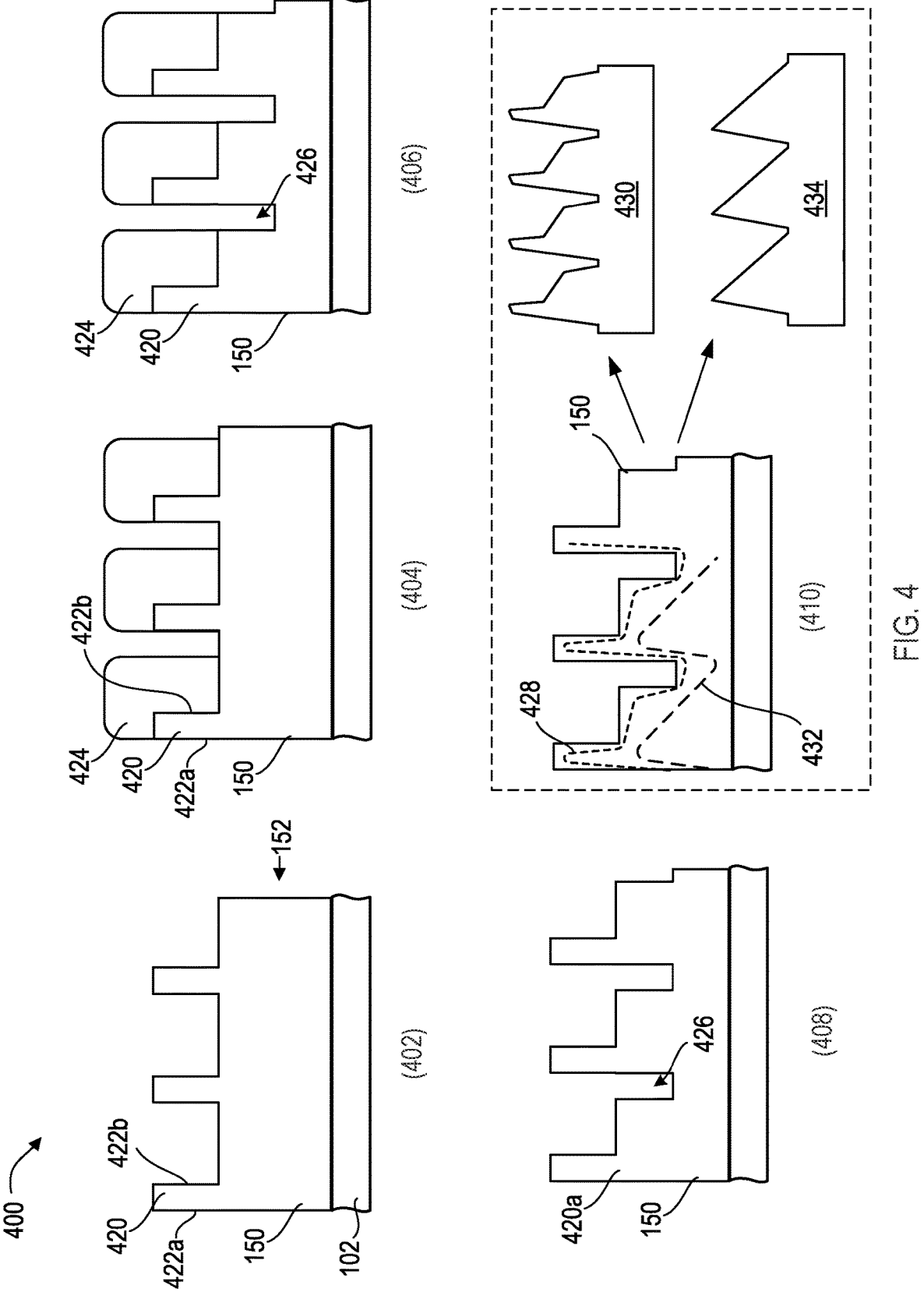
FIG. 4 illustrates an example process for fabricating asymmetric structures in accordance with implementations of the present disclosure.

FIG. 4 illustrates an example process 400 for fabricating asymmetric structures in accordance with implementations of the present disclosure. At step (402), a plurality of discrete structures 420 are formed on a substrate 102. The structures 420 can be formed by, for example, imprint lithography, photo lithography and etching, or other appropriate fabrication techniques. For example, the structures 420 can be formed using an imprint lithography system 100, as described above. The structures 420 have a generally symmetric profile. In other words, the shape of one side 422a of each structure 420 is substantially the same as the shape of the opposite side 422b of each structure 420 forming a left-right symmetry. The starting profile of the structures 420 can include any generally symmetric shape including, but not limited to, a square profile, a rectangular profile, a trapezoidal profile, or a triangular profile. Additionally, the structures 420 can be micro- or nano-structures.

At step (404), a masking material 424 is applied to the structures 420. The masking material 424 is applied under conditions that cause the masking material to asymmetrically cover the structures 420. For example, as shown, the masking material 424 completely covers side 422b of the structures 420, but does not cover side 422a of the structures 420. However, the masking material 424 need not be applied strictly as shown in FIG. 4. The masking material 424 can be applied to cover the structures 420 in any desired asymmetric pattern. For example, side 422b may be only partially covered by the masking material 424, but not completely covered. Side 422a may be partially covered by the masking material 424. For example, a portion of both sides 422a and 422b may be covered by the masking material 424. However, to maintain the asymmetric application of the masking material 424 to the structures 420, the portion of side 422a that is covered by the masking material 424 may be smaller than the portion of side 422b that is covered by the masking material 424.

The masking material 424 can be applied using deposition processes including, but not limited to, chemical vapor deposition (CVD) and physical vapor deposition (PVD). Example conditions for asymmetrically applying the masking material 424 are described in more detail below in reference to FIGS. 7A-7C. Further, the masking material 424 can include one of the following materials: Cr, Ti, SiO$_2$, Al$_2$O$_3$, ZrO$_2$, Ag, Pt, or Au.

At step (406), the structures 420 are etched. Specifically, in the example shown, the patterned layer 150 is etched to modify the overall shape of the structures 420, thereby, producing an asymmetric profile in the structures 420. For example, the portions of the structures 420 (and patterned layer 150) that are not covered by the masking material 424 are etched to form recessions 426. The structures 420 can be etched using etching processes including, but not limited to, a wet etch process, a plasma etching process, a dry etch process, or an ion beam etching/milling process.

At step (408), the masking material 424 is removed. For example, the masking material 424 can be stripped from the structures 420 and patterned layer 150 using a plasma or chemical stripping process. As shown, removing the masking material reveals the asymmetric profile of the structures 420a produced by the asymmetric application of the masking material 424 and the subsequent etching.

In some implementations, at optional step (410), the asymmetric structures 420a are etched a second time to further alter their shape. For example, a second etch without a masking material applied to the structures can be used to round or smooth the edges of the asymmetric structures 420a. The timing and/or techniques used to perform the second etch can be altered to produce differing profiles such as profile 428 producing asymmetric structures 430 or profile 432 producing asymmetric structures 434. For example, the profile 428 (asymmetric structure 430) can be produced from asymmetric structures 420a by using a relatively lower ion energy etch recipe (e.g., higher pressure, lower power) with $CHF_3$, $CF_4$, and Ar. The more tapered profile 432 (asymmetric structure 434) can be produced from asymmetric structures 420a by using a relatively higher ion energy etch recipe (e.g., lower pressure, higher power) with $CF_4$ and Ar.

Figure 7A:
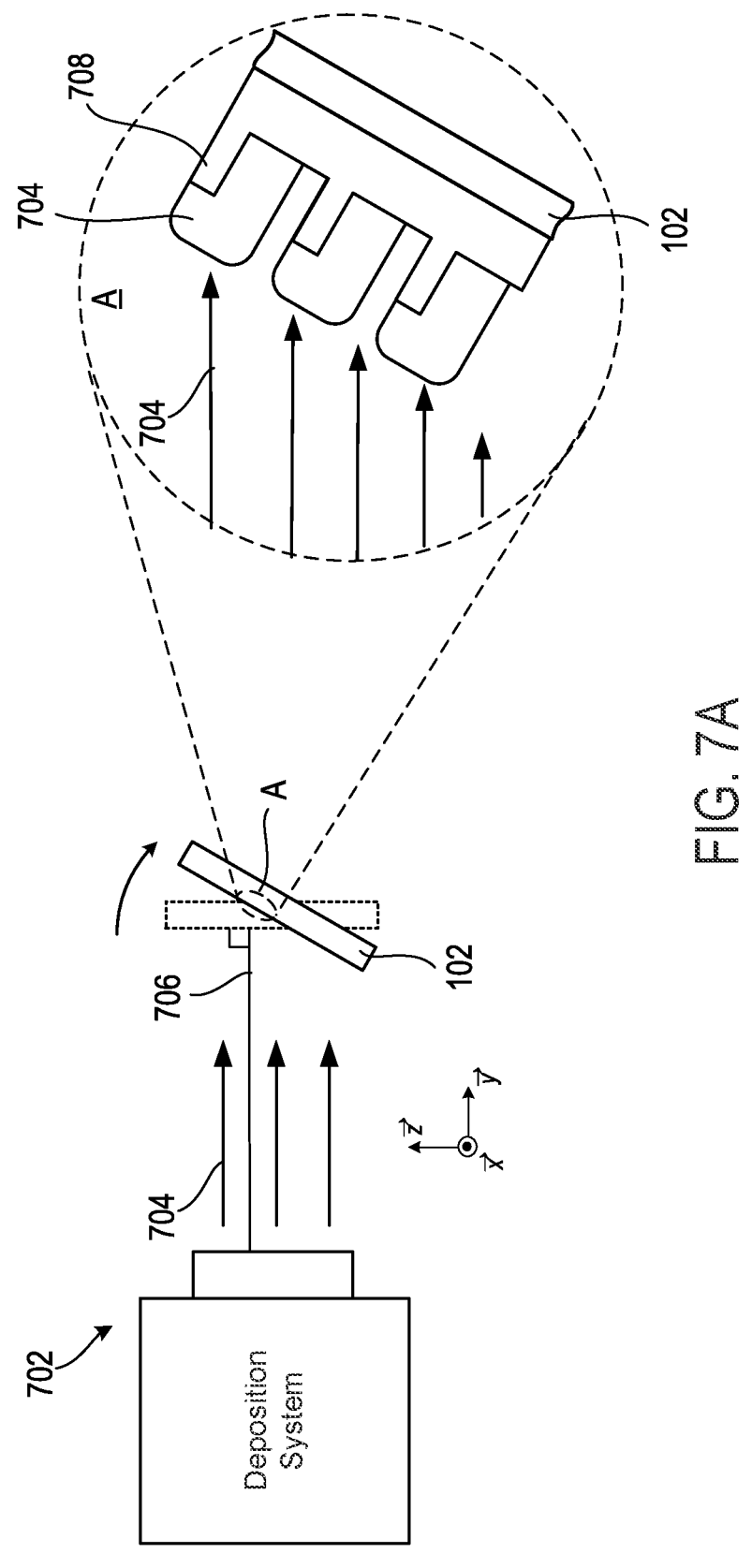
FIGS. 7A-7C illustrates an example process for asymmetrically applying a masking material to structures on a substrate in accordance with implementations of the present disclosure.
Figures 7B, 7C:
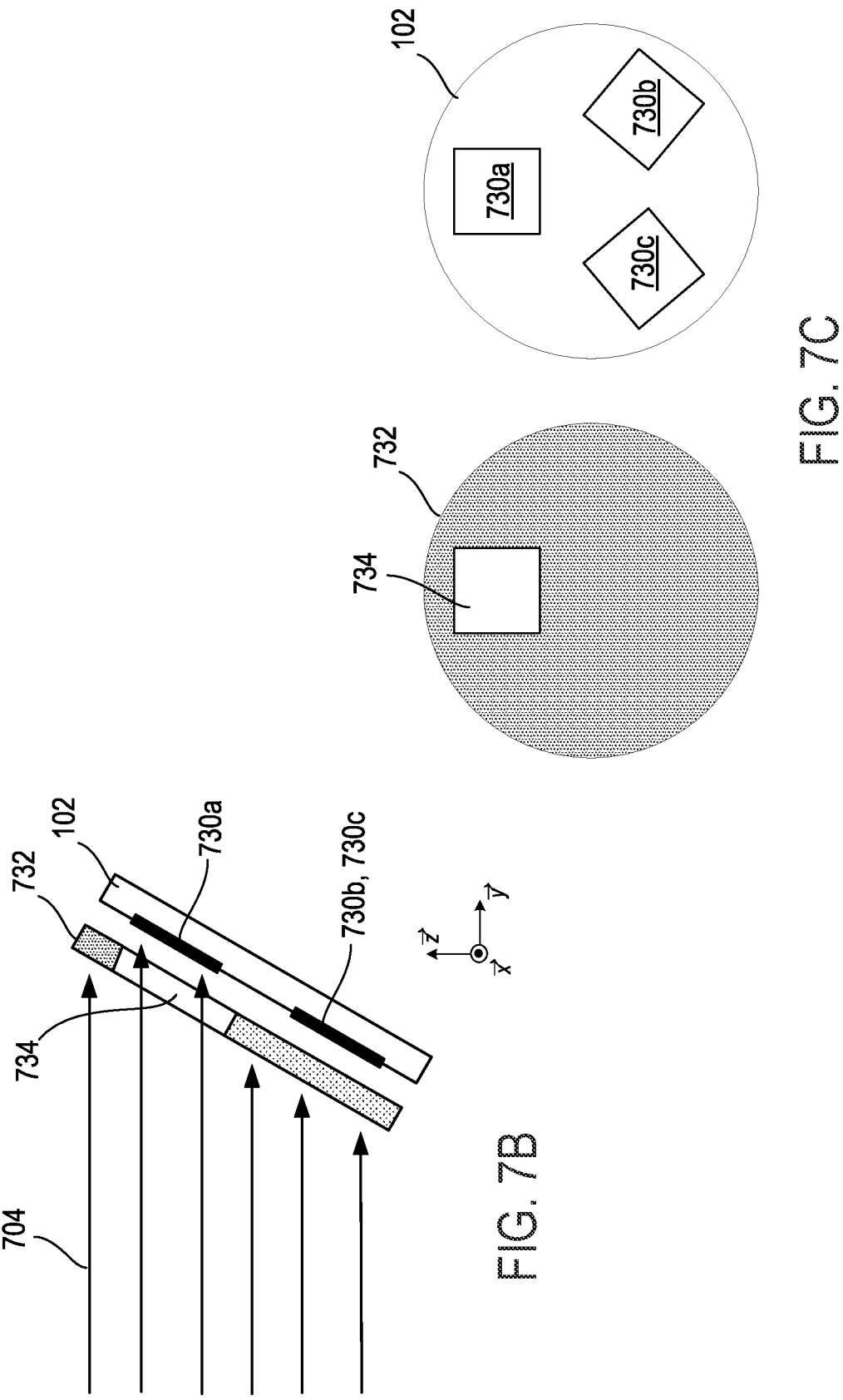

FIGS. 7A-7C illustrate an example process for asymmetrically applying a masking material to structures on a substrate in accordance with implementations of the present disclosure. FIG. 7A shows a simplified block diagram of a deposition system 702. For example, deposition system 702 can be a CVD system or a PVD system. The deposition system 702 deposits a deposition material 704 (e.g., a masking material) on a substrate 102. The deposition material 704 is generally in a gaseous phase as it is transferred to the substrate 102. For example, in a CVD system the deposition material 704 may be a source gas, while in a PVD system the deposition material 704 may be a source material that is evaporated or sputtered onto the substrate 102.

The deposition system 702 directs the deposition material 704 onto the substrate along a general deposition direction 706 (e.g., along the y-axis as shown). One of skill in the art will appreciate that while the deposition material 704 does not truly travel along a single straight path due to the random motions of gas molecules, a general deposition direction can be determined. That is, the deposition material 704 is generally directed towards the substrate from a narrow range of directions; not omnidirectionally. For simplicity, however, the deposition direction 706 will be referred to as a straight path.

The substrate 102 is inclined relative to the deposition direction 706. More specifically, the substrate 102 is inclined such that the substrate 102 forms a non-normal angle to the deposition direction 706 of the deposition system. Inclining the substrate 102 at such an angle cause the deposition material 704 to be applied asymmetrically to any structures that extend outward from the substrate 102 (e.g., structures 420 of FIG. 4). For example, as shown in enlarged region "A" of the substrate, when inclined one side of the structures 708 blocks or shadows the opposite side of the structures 708 from the path of the deposition material 704. The deposition material is therefore preferentially deposited on the unblocked side of the structures 708.

In some implementations, the substrate 102 can be mounted on a pilotable platform that allows the substrate 102 to be inclined at a variety of angles relative the deposition direction 706. In multi-step fabrication processes (as described below with respect to FIG. 5) this may permit the application of a first masking material at a first incline angle and subsequent masking materials at different incline angles. Furthermore, the substrate 102 may be pivoted about multiple axes to produce different structure geometries by asymmetrically masking different sides of the structures 708. For example, while the substrate 102 shown in FIG. 7A is illustrated as being inclined about the x-axis extending out of the page, for subsequent applications of masking material the substrate 102 may be pivoted about the z-axis.

Referring to FIGS. 7B and 7C, in some implementations, the deposition substrate may include multiple different regions 730a, 730b, 730c of structures. For such implementations, the deposition system 702 can include a mask or shutter 732 to preferentially apply masking materials to one or more particular regions (e.g., region 730a) while preventing the deposition material 704 from contacting the other regions (e.g., region 730b, 730c). Either the substrate 102 or mask/shutter 732 can be rotated remotely to alternate between which regions 730a, 730b, 730c are exposed to the deposition material 704 without the need to break pressure or temperature conditions of the deposition system 702 or without the need to alter the incline angle of the substrate 102. For example, the substrate 102 can be remotely rotated to alternately align each region 730a, 730b, 730c of structures with the window 734 in the mask/shutter 730. In some implementations, the mask/shutter 732 may permit application of deposition material 704 to each region 730a, 730b, 730c of structures using a different incline angle for the substrate 102 without the need to break pressure or temperature conditions of the deposition system 702.

Figure 5:
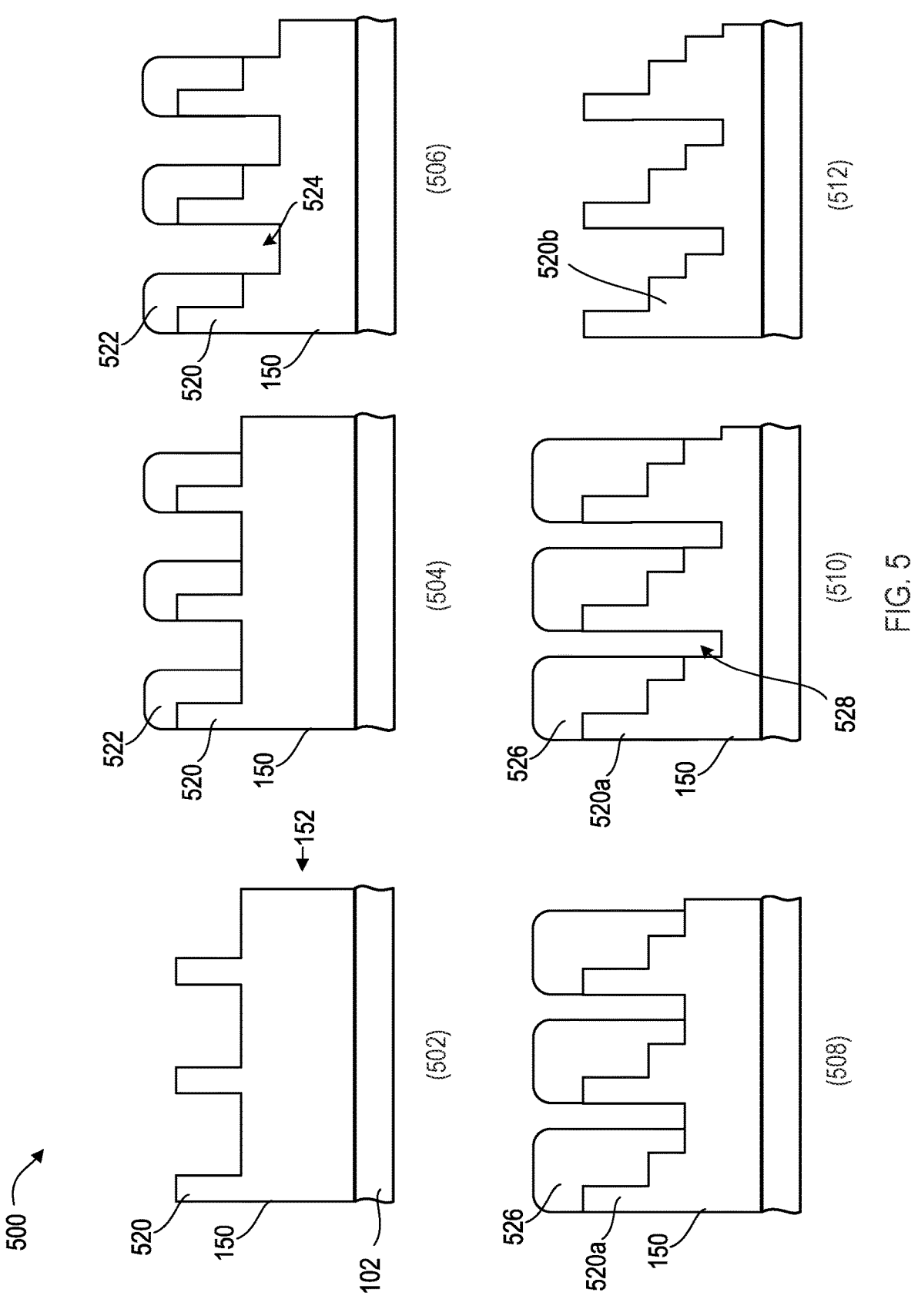
FIG. 5 illustrates a second example process for fabricating asymmetric structures in accordance with implementations of the present disclosure.

In some implementations, process 400 can be repeated as shown in FIG. 5 and discussed below. FIG. 5 illustrates a second example process 500 for fabricating asymmetric structures. Process 500 is similar to process 400, however, process 500 includes multiple iterations of the some of the steps of process 400.

At step (502), a plurality of discrete structures 520 are formed on a substrate 102. The structures 520 can be formed by, for example, imprint lithography, photo lithography and etching, or other appropriate fabrication techniques. For example, the structures 520 can be formed using an imprint lithography system 100, as described above. Similar to structures 420 discussed above, the structures 520 have a generally symmetric profile. Additionally, the structures 520 can be micro- or nano-structures.

At step (504), a masking material 522 is applied to the structures 520. The masking material 522 is applied under conditions that cause the masking material to asymmetrically cover the structures 520. For example, as discussed above with respect to masking material 424, the masking material 522 need not be applied strictly as shown in FIG. 5. The masking material 522 can be applied to cover the structures 520 in any desired asymmetric pattern. The masking material 522 can be applied using deposition processes including, but not limited to, chemical vapor deposition (CVD) and physical vapor deposition (PVD). For example, as discussed above with respect to FIGS. 7A-7C, the masking material 522 can be applied to the structures 520 by inclining the substrate 102 at a non-normal incline angle to the direction from which the masking material is being deposited. Further, the masking material 522 can include one of the following materials: Cr, Ti, $SiO_2$, $Al_2O_3$, $ZrO_2$, Ag, Pt, or Au.

At step (506), the structures 520 are etched. Specifically, in the example shown, the patterned layer 150 is etched to modify the overall shape of the structures 520, thereby, producing an asymmetric profile in the structures 520. For example, the portions of the structures 520 (and patterned layer 150) that are not covered by the masking material 522 are etched to form recessions 524. The structures 520 can be etched using etching processes including, but not limited to, a wet etch process, a plasma etching process, a dry etch process, or an ion beam etching/milling process.

At step (508), the masking material 522 is removed and a second masking material 526 is applied to the, now, modified structures 520a. As noted above, the masking material 522 can be stripped from the structures 520 and patterned layer 150 using a plasma or chemical stripping process. As shown, the modified structures 520a have an asymmetric profile produced by the asymmetric application of the masking material 522 and the subsequent etching. The shape of the modified structures 520a can be further altered by applying a second masking material 526 to the modified structures 520a. The second masking material 526 can be the same material or a different material from that of the first masking material 522.

The second masking material 526 can be applied similarly to the first masking material (e.g., as shown). In other words, the second masking material can be applied asymmetrically to the same side of the structures 520a that the first masking material was applied to the structures 520. In some implementations, the second masking material can be applied asymmetrically to a different side of the structures 520a or in different proportions to various sides of the structures 520a than how the first masking material 522 was applied to the structures 520. For example, as discussed above, the first masking material 522 can be applied to the structures 520 by inclining the substrate 102 at a non-normal incline angle to the direction from which the masking material is being deposited. Accordingly, the second masking material 526 can be applied by inclining the substrate 102 at an angle different from that used to apply the first masking material 522. The substrate 102 can be rotated or inclined about a different axis such that the second masking material 526 is applied to a different side of the structures 520a than that to which the first masking material 522 was applied to the structures 520.

At step (510), the structures 520a are etched. Specifically, in the example shown, the patterned layer 150 is etched to modify the overall shape of the structures 520a, thereby, further modifying the asymmetric profile of the structures 520a. For example, the portions of the structures 520a (and patterned layer 150) that are not covered by the masking material 526 are etched to form recessions 528. The structures 520a can be etched using etching processes including, but not limited to, a wet etch process, a plasma etching process, a dry etch process, or an ion beam etching/milling process.

At step (512), the masking material 526 is removed. For example, the masking material 526 can be stripped from the structures 520 and patterned layer 150 using plasma or chemical stripping. As shown, removing the masking material reveals the asymmetric profile of the structures 520b produced by the asymmetric application of the masking material 526 and the subsequent etching.

The optional step (408) of process 400 can be performed either after step (512), after the first masking material 522 is removed in step (506), or both. More specifically, either the asymmetric structures 520a, 520b, or both can be etched without a masking material applied to further alter their shape.

Figure 6:
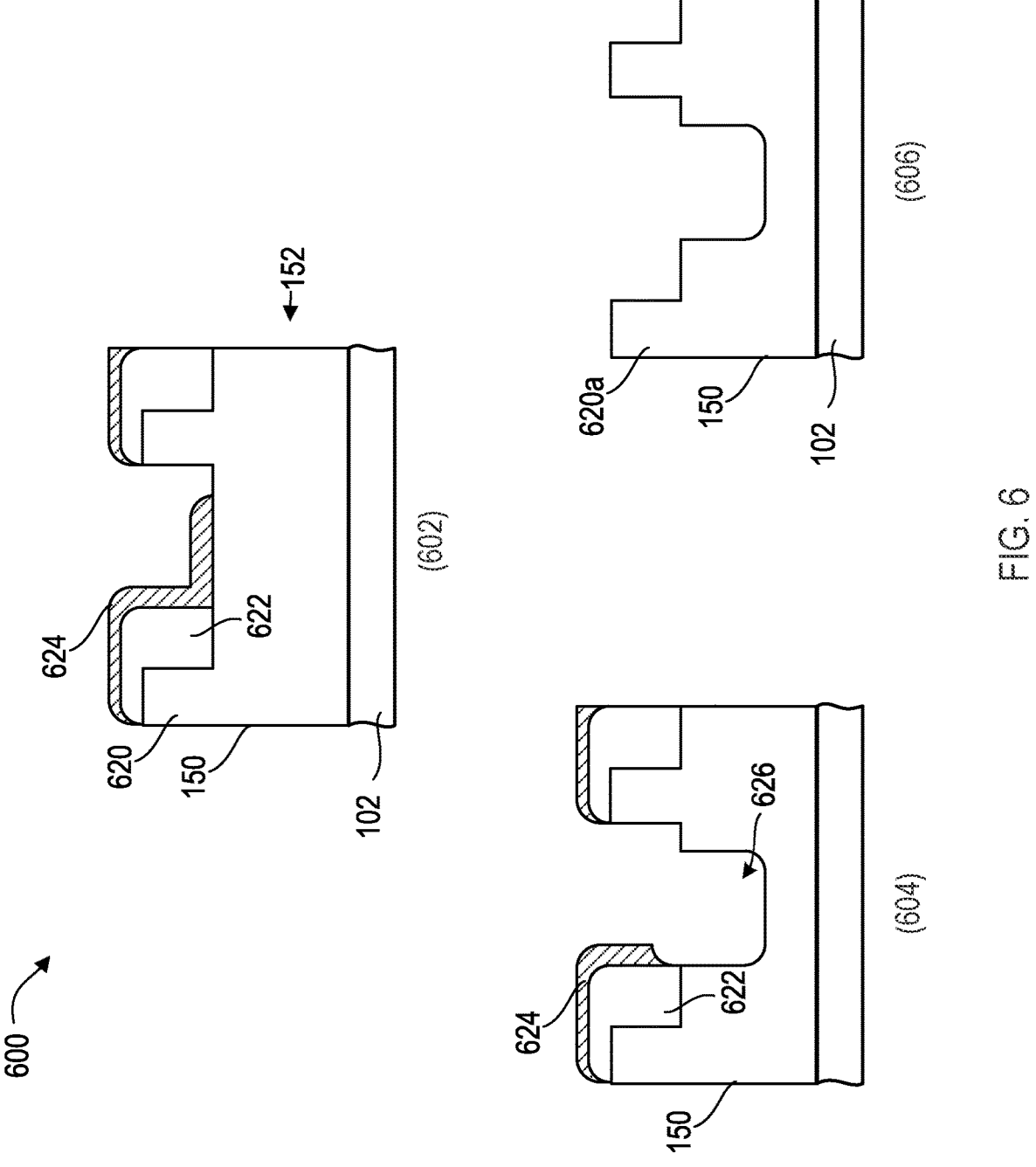
FIG. 6 illustrates a third example process for fabricating asymmetric structures in accordance with implementations of the present disclosure.

FIG. 6 illustrates a third example process 600 for fabricating asymmetric structures. Process 600 includes the use of an asymmetrically applied metal assisted chemical etching (MACE) material for the fabrication of asymmetric structures. As in processes 400 and 500, a plurality of discrete structures 620 are formed on a substrate 102. The structures 620 can be formed by, for example, imprint lithography, photo lithography and etching, or other appropriate fabrication techniques. Similar to structures 420 and 520 discussed above, the structures 620 have a generally symmetric profile. Additionally, the structures 620 can be micro- or nano-structures.

At step (602), a masking material 622 and a MACE catalyst material 624 are applied to the structures 620. The masking material 622 and a catalyst material 624 are applied under conditions that cause masking material 622 and a catalyst material 624 to asymmetrically cover the structures 620. For example, the masking material 622 and catalyst material 624 can be applied using deposition processes including, but not limited to, CVD and PVD processes. Example conditions for asymmetrically applying the masking material 622 and catalyst material 624 are described in more detail below in reference to FIGS. 7A-7C. Further, the masking material 622 can include one of the following materials: Cr, Ti, SiO₂, Al₂O₃, ZrO₂, Ag, Pt, or Au. The catalyst material 624 can include one of the following materials: Au, Pt, Au—Pd alloy, In some implementations, the masking material 622 and the catalyst material 624 can be applied under different conditions to produce different asymmetric patterns, as shown in FIG. 6. For example, the masking material 622 may be applied by inclining the substrate 102 at a first angle relative to a deposition direction of a deposition system, and the catalyst material 624 can be applied by inclining the substrate 102 at a second angle that is different from the first angle.

In some implementations, the catalyst material 624 may be applied to the structures alone, without the masking material 622. Furthermore, although the masking material is described and shown as being applied to the structures before the catalyst material 624, in some implementations, the catalyst material 624 may be applied before the masking material 622.

At step (604), the structures 620 are etched. Specifically, in the example shown, the patterned layer 150 is etched to modify the overall shape of the structures 620, thereby, producing an asymmetric profile in the structures 620. For example, the portions of the structures 620 (and patterned layer 150) that are not covered by the masking material 622 but which are covered by the catalyst material 624 are etched to form recessions 626. The catalyst material 624 causes those portions of the structures 620 and patterned layer 150 that are in contact with the catalyst to be etched at a higher rate than the structures 620 and patterned layer 150 alone.

At step (606), the masking material 622 and any remaining catalyst material 624 are removed. For example, the masking material 622 and remaining catalyst material 624 can be stripped from the structures 620 and patterned layer 150 using a plasma or chemical stripping process. As shown, removing the masking material 622 and remaining catalyst material 624 reveals the asymmetric profile of the structures 620a produced by process 600.

Figure 8:
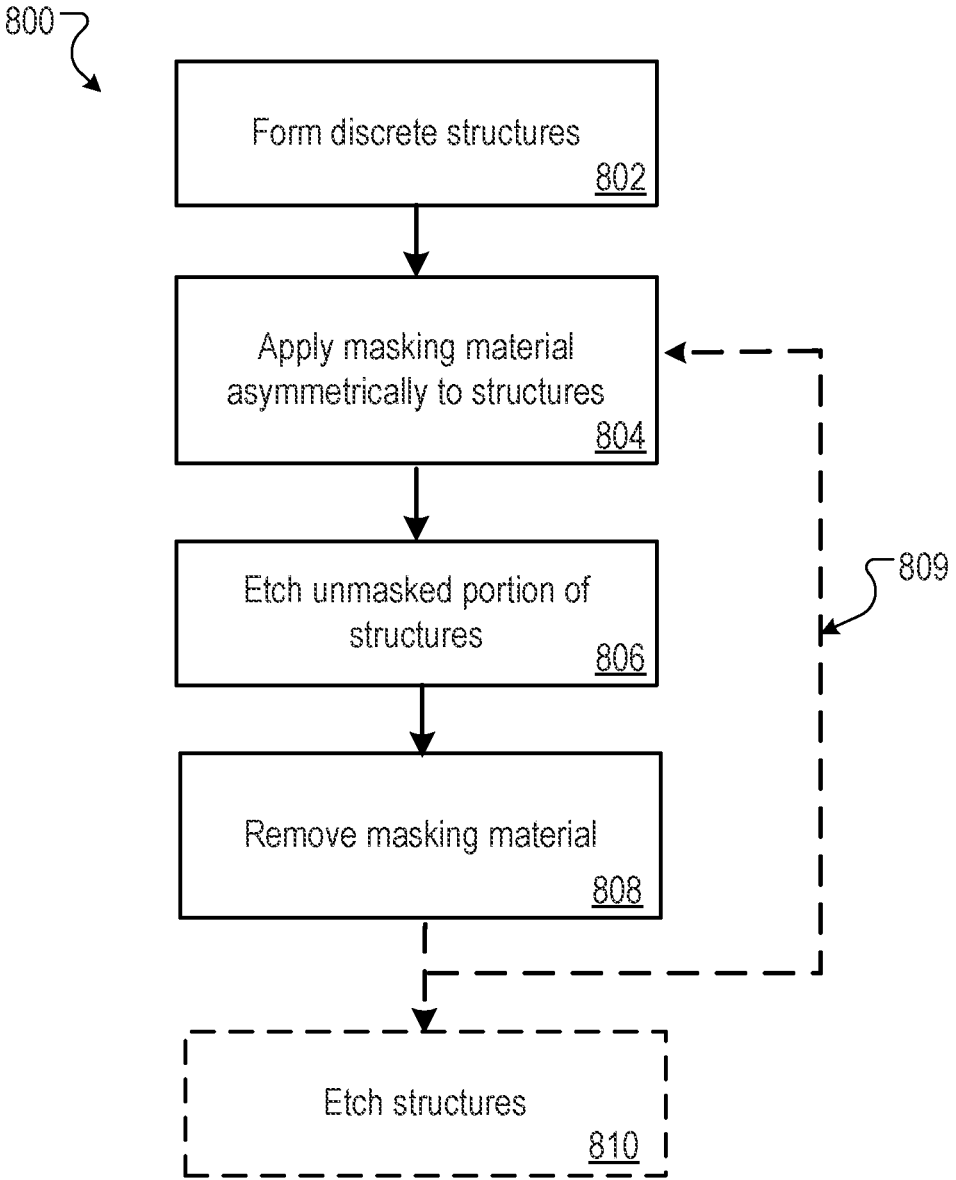
FIG. 8 shows a flowchart of an example method for fabricating asymmetric structures in accordance with implementations of the present disclosure.

FIG. 8 shows a flowchart of an example method 800 for fabricating asymmetric structures in accordance with implementations of the present disclosure. The process 800 is illustrated as a collection of referenced acts arranged in a logical flow graph. The order in which the acts are described is not intended to be construed as a limitation, and any number of the described acts can be combined in other orders and/or in parallel to implement the process.

A plurality of discrete structures are formed on a substrate (802). The structures can be formed by, for example, imprint lithography, photo lithography and etching, or other appropriate fabrication techniques. For example, the structures can be formed using an imprint lithography system 100, as described above. In some examples, the structures have a generally symmetric profile. In other words, the shape of one side of each structure is substantially the same as the shape of the opposite side of each structure, thereby, forming a left-right symmetry. The starting profile of the structures can include any generally symmetric shape including, but not limited to, a square profile, a rectangular profile, a trapezoidal profile, or a triangular profile. Additionally, the structures can be micro- or nano-structures.

In some implementations, the structures are formed in multiple separate regions. For example, multiple fields of structures can be formed on a single substrate. In some cases, each region of structures is processed similarly to form similarly shaped asymmetric structures. In other cases, each region of structures is processed differently to form differently shaped asymmetric structures on the same substrate.

A masking material is asymmetrically applied to the structures (804). The masking material is applied under conditions that cause the masking material to form an asymmetric masking pattern that asymmetrically covers the structures. For example, for each or some of the structures, the masking material may completely cover a first side of a structures, but may not cover a second, opposite side of the structure. The masking material can be applied to cover the structures in any desired asymmetric pattern. For example, a first side of the structures may be only partially covered by the masking material, but not completely covered. A second, opposite side may also be partially covered by the masking material. However, to maintain the asymmetric application of the masking material to the structures, the portion of the first side that is covered by the masking material may be smaller than the portion of second side that is covered by the masking material.

The masking material can be applied using deposition processes including, but not limited to, CVD and PVD processes. Conditions for asymmetrically applying the masking material can include inclining the substrate at a non-normal angle to a direction from which deposition material is transferred to the substrate in a deposition system (e.g., as described above in reference to FIGS. 7A-7C). Further, the masking material can include one of the following materials: Cr, Ti, $SiO_2$, $Al_2O_3$, $ZrO_2$, Ag, Pt, or Au. In some implementations, a MACE catalyst material can be asymmetrically applied to the structures in addition to or in place of the masking material (e.g., as described in reference to process 600 above).

Unmasked portions of the structures are etched (806). The structures and/or layer(s) of material below the structures is etched to modify the overall shape of the structures, and thereby, produce an asymmetric profile in the structures. For example, the portions of the structures that are not covered by the masking material are etched to form recessions in the structures and/or a residual layer of material below the structures. The structures can be etched using etching processes including, but not limited to, a wet etch process, a plasma etching process, a dry etch process, or an ion beam etching/milling process.

The masking material is removed from the structures (808). For example, the masking material can be stripped from the structures and underlying layer(s) using a plasma or chemical stripping process. Removing the masking material reveals the asymmetric profile of the structures produced by the asymmetric application of the masking material and the subsequent etching.

In some implementations, the process returns to step (804) and steps (804)-(808) are repeated, as indicated by dashed line 809. For example, as discussed with respect to process 500 above, the steps (804)-(808) can be repeated to further alter the asymmetric shape of the structures. For example, another masking material can be applied under different conditions to produce a different asymmetric masking pattern.

The structures are, optionally, etched without a masking material applied (810). For example, a second etch without a masking material applied to the structures can be used to round or smooth the edges of the asymmetric structures. The timing and/or techniques used to perform the second etch can be altered to produce differing profiles.

Asymmetric micro- and nano-structures can be used to create diffraction patterns for use in optical devices. For example, diffraction patterns that include asymmetric structures may provide more efficient optical diffraction patterns for devices such as diffraction lenses or optical couplers used in optical wave guides.

Figure 9B:
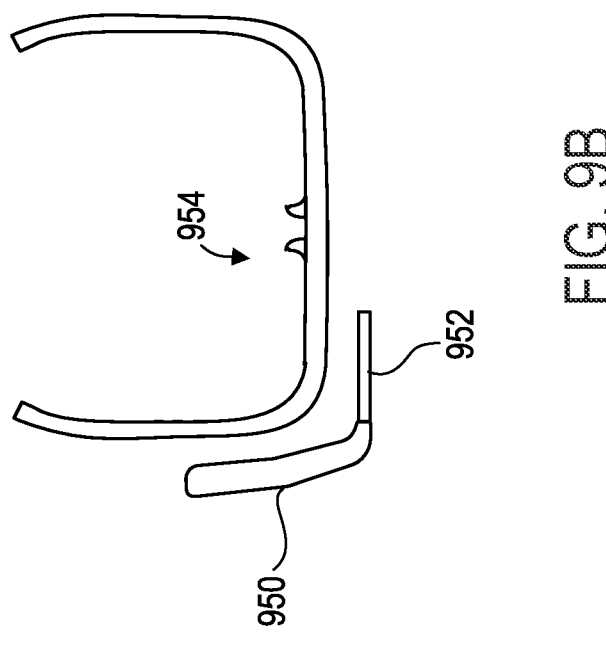
FIGS. 9A-9B show example devices in which asymmetric structures can be used.
Figure 9A:
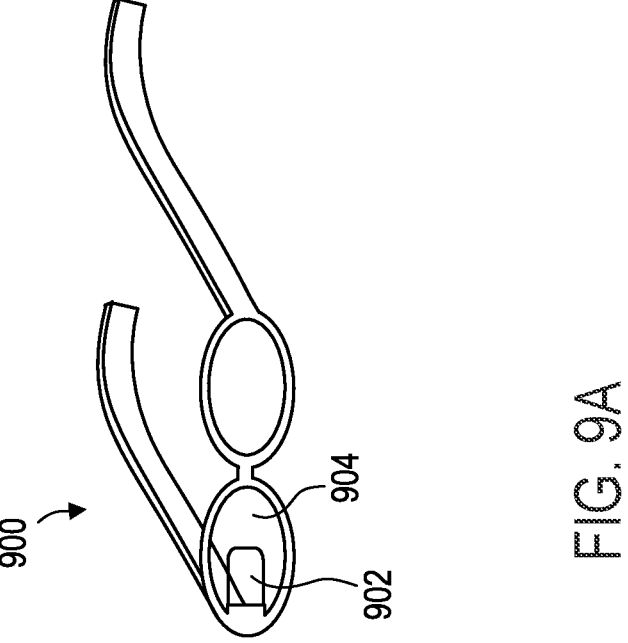

FIGS. 9A-9B show example devices in which asymmetric structures are used. FIG. 9A shows a perspective of example an optical system 900. The optical system 900 is, for example, an optical projection system illustrated as a pair of virtual reality or augmented reality glasses. The example optical system can include diffraction lenses and couplers to project an image on a lens 904 of the system 900. The system 900 can receive data representing image (e.g., from a processor) and project the image onto a region 902 on a lens 904 of the system 900. Accordingly, a user can view both an image projected in the region 902 as being overlaid on a scene that is visible through the lenses 904. Other example projection systems can include, but are not limited to, video projectors, mobile video projectors, heads-up displays (e.g., heads-up displays for vehicles), microscopes, telescopes, and other optical devices. In other example optical systems 900 asymmetric structures can be used in reflective polarizer films (e.g., GLAD Wire Grid Polarizers). For example, asymmetric structures can be used in reflective polarizing films for LCD display systems such as those used in smartphones, LCD monitors, LCD televisions, tablet computers, etc.

FIG. 9B shows a top view of a waveguide 950 for projecting an image within a lens 952 that can be positioned in front of a user's eye. For example, waveguide 950 can be attached to a pair of glasses 954 to provide augmented reality images to the user. The waveguide 950 receives image data from a processor and projects the an image within the lens 952 of the waveguide 950.

Diffraction lenses and optical couplers in the projection system 900 and the waveguide 950 can include diffraction patterns with asymmetric micro- and/or nano-structures (as disclosed above) to improve the diffraction efficiency of such lenses and optical couplers. For example, improved diffraction efficiency may result in brighter, more visible images to a user. Improved diffraction efficiency may also result in energy savings for augmented reality and other optical systems.

Although diffraction patterns are described in reference to optical systems, it should be understood that implementations of the present disclosure are not limited to diffraction patterns for visible light. Instead, the micro- and nano-structures described herein and processes to fabricate the same can be used to produce diffraction patterns for various electromagnetic waves having wavelengths corresponding to features of the fabricated structures. For example, the micro- and nano-structures described herein may be functional in diffraction patterns for electromagnetic waves ranging from infrared (IR) wavelengths to ultraviolet (UV) wavelengths, and potentially to X-rays.

While a number of examples have been described for illustration purposes, the foregoing description is not intended to limit the scope of the invention, which is defined by the scope of the appended claims. There are and will be other examples and modifications within the scope of the following claims.

The invention claimed is:

1. An optical device comprising:
    a substrate; and
    a diffraction pattern on the substrate, the diffraction pattern comprising a plurality of asymmetric structures extending from a common surface of the substrate, wherein each asymmetric structure of the plurality of asymmetric structures has a first side surface and a second side surface opposite the first side surface, and a profile of the first side surface is asymmetric with respect to a profile of the second side surface, and wherein at least one asymmetric structure of the plurality of asymmetric structures has an asymmetric profile, wherein:

the first side surface of the at least one asymmetric structure extends linearly from the common surface to a top portion of the asymmetric structure, the second side surface of the at least one asymmetric structure comprises at least a first portion and a second portion, wherein:

the first portion of the second side surface is angled with respect to the common surface at a first angle, wherein the first angle is a non-zero angle, and the second portion of the second side surface is angled with respect to the common surface at a second angle different from the first angle, wherein the second angle is a non-zero angle, and a plane extending along the first side surface and a plane extending along the first portion of the second side surface intersect above the top portion of the asymmetric structure.

2. The device of claim 1, wherein one or more first asymmetric structures of the plurality of asymmetric structures have an asymmetric triangular profile.

3. The device of claim 1, wherein the asymmetric profile of the at least one asymmetric structure of the plurality of asymmetric structures has an asymmetric stepped profile comprising a linear profile of the first side surface and a stepped profile of the second side surface.

4. The device of claim 1, wherein a recess is defined between adjacent asymmetric structures of the plurality of asymmetric structures.

5. The device of claim 4, wherein a surface of the recess is parallel to a surface of the substrate.

6. The device of claim 1, wherein the asymmetric structures comprise one of Si, $SiO_2$, a polymer material, or an organic-inorganic hybrid material.

7. The device of claim 1, wherein the asymmetric structures are nano-structures or micro-structures.

8. The device of claim 1, wherein the plurality of asymmetric structures include a plurality of first asymmetric structures having a first asymmetric profile and a plurality of second asymmetric structures having a second asymmetric profile that is different from the first asymmetric profile.

9. The device of claim 1, wherein each asymmetric structure of the plurality of asymmetric structures has rounded edges.

10. The device of claim 1, wherein the device is a waveguide.

11. The device of claim 1, wherein the device is an optical projection system, a virtual reality system, an augmented reality system, or a pair of eyeglasses.

12. A virtual or augmented reality system comprising the optical device of claim 1.

13. An optical device comprising:

a substrate; and a diffraction pattern on the substrate, the diffraction pattern comprising a plurality of asymmetric structures extending from a common surface of the substrate, wherein each asymmetric structure of the plurality of asymmetric structures has a first side surface and a second side surface opposite the first side surface, wherein a profile of the first side surface is asymmetric with respect to a profile of the second side surface, wherein at least one asymmetric structure of the plurality of asymmetric structures has an asymmetric profile, and wherein the plurality of asymmetric structures are formed by a process comprising:

applying a metal catalyst layer over a plurality of discrete structures under first conditions that cause the metal catalyst layer to asymmetrically cover the plurality of discrete structures such that at least a first portion of a first side of each structure of the plurality of discrete is free of the metal catalyst layer;

after applying the metal catalyst layer, applying a masking material over the plurality of discrete structures under second conditions that cause the masking material to asymmetrically cover the plurality of discrete structures such that at least a second portion of a second side of each structure is free of the masking material, wherein the masking material comprises one of $SiO_2$, $Al_2O_3$, or $ZrO_2$;

etching a first area of the plurality of discrete structures that is not covered by the masking material;

stripping the masking material from the plurality of discrete structures; and wet etching a second area of the plurality of discrete structures with metal assisted chemical etching to yield the asymmetric structures, wherein:

the first side surface of the at least one asymmetric structure extends linearly from the common surface to a top portion of the asymmetric structure, the second side surface of the at least one asymmetric structure comprises at least a first portion and a second portion, wherein:

the first portion of the second side surface is angled with respect to the common surface at a first angle, wherein the first angle is a non-zero angle, and the second portion of the second side surface is angled with respect to the common surface at a second angle different from the first angle, wherein the second angle is a non-zero angle, the first portion extends linearly from the second portion of the side surface to the top portion of the asymmetric structure, and a plane extending along the first side surface and a plane extending along the first portion of the second side surface intersect above the top portion of the asymmetric structure.

14. The device of claim 13, wherein the device is an optical projection system, a virtual reality system, an augmented reality system, or a pair of eyeglasses.

15. A virtual or augmented reality system comprising the optical device of claim 13.

* * * * *